United States Patent [19]

Cole et al.

[11] 3,796,926

[45] Mar. 12, 1974

[54] BISTABLE RESISTANCE DEVICE WHICH DOES NOT REQUIRE FORMING

[75] Inventors: James N. Cole, Peekskill; Jerome J. Cuomo, Bronx; Robert B. Laibowitz, Peekskill; Kyu C. Park, Yorktown Heights, all of N.Y.

[73] Assignee: International Business Machines Corporation, Armonk, N.Y.

[22] Filed: Mar. 29, 1971

[21] Appl. No.: 128,832

[52] U.S. Cl. .............. 317/234 R, 29/584, 252/63.5, 317/234 S, 317/234 T, 317/234 V, 317/235 AP, 317/235 AQ

[51] Int. Cl. .............................................. H01l 3/16

[58] Field of Search ......... 317/234 S, 234 T, 234 V, 317/237, 238

[56] References Cited

UNITED STATES PATENTS

| | | | |
|---|---|---|---|
| 3,564,348 | 2/1971 | Cheseldine | 317/238 X |
| 3,656,029 | 4/1972 | Ahn et al. | 317/234 V |
| 3,336,514 | 8/1967 | Hiatt et al. | 317/234 |
| 3,571,669 | 3/1971 | Fleming | 317/234 |
| 3,571,670 | 3/1971 | Ovshinsky | 317/234 |
| 3,588,639 | 6/1971 | Ovshinsky et al. | 317/238 |
| 3,343,076 | 9/1967 | Ovshinsky | 317/237 UX |
| 3,571,671 | 3/1971 | Ovshinsky | 317/234 |
| 3,571,673 | 3/1971 | Ovshinsky et al. | 317/234 |

OTHER PUBLICATIONS

Mataré, "Semiconductor Glasses," Solid State Technology, January 1969 (pp. 43–46)

*Primary Examiner*—Rudolph V. Rolinec
*Assistant Examiner*—William D. Larkins
*Attorney, Agent, or Firm*—Jackson E. Stanland

[57] ABSTRACT

A switchable device using a doped insulator having two stable resistance states which does not require application of a forming voltage when being fabricated. The insulator is, for example, a multivalent oxide of 100–2,500 A thickness, containing impurities which provide conduction centers. Examples of these impurites include Bi, Sb, As, P, Ti, W, in amounts 0.05–10 percent by weight ($10^{18}$–$10^{21}$ impurities/cm.$^3$). The insulator is contacted by two electrodes which can be metals, such as transition metals. A particularly good device is NbBi alloy — $NbBi_xO_y$—Bi.

6 Claims, 4 Drawing Figures

PATENTED MAR 12 1974

3,796,926

INVENTORS
JAMES N. COLE
JEROME J. CUOMO
ROBERT B. LAIBOWITZ
KYU CHANG PARK

BY J. E. [signature]

AGENT

BISTABLE RESISTANCE DEVICE WHICH DOES NOT REQUIRE FORMING

BACKGROUND OF THE INVENTION

1. Field of the Invention

This invention relates to switchable bistable resistance devices, and more particularly to those devices which have a doped insulator that exhibits two stable resistance states.

2. Description of the Prior Art

Bistable resistance devices exhibiting memory effects have been proposed in recent years. These include ovonic devices and glassy semiconductor chalcogenides, as well as metal oxide devices. In general, the devices exhibit two stable resistance states which are selectively addressed by the application of current or voltage pulses. In particular, amorphous insulator devices exhibiting bistable resistance have been proposed using niobium oxide in conjunction with suitable electrodes. The niobium oxide insulator is generally about 1,300A thick while the electrodes are at least about 200A thick. Application of bipolar pulses causes the device to switch between high and low resistance states.

Amorphous insulator bistable resistance devices are described in the following literature and patents, which are listed here to provide background information.

1. U.S. Pat. No. 3,336,514
2. U.S. Pat. No. 3,047,424
3. IBM Technical Disclosure Bulletin, Vol. 13, No. 5, October 1970, p. 1189
4. Hiatt, et al., "Bistable Switching in Niobium Oxide Diodes," Applied Physics Letters, Vol. 6, No. 6, Mar. 15, 1965, p. 106
5. T. Hickmott, Journal of Applied Physics, "Electroluminescence and Conduction in Nb—$Nb_2O_5$—Au Diodes," Vol. 37, No. 12, November 1966, p. 4380

The insulator devices described in the prior art require application of a forming voltage in order to have a low resistance state. The forming voltage is approximately 30 volts for 1,300A thick niobium oxide films. Generally, a DC or a rectified AC voltage is applied to the device via a current limiting resistor with the positive node of the voltage source connected to the counter electrode.

The forming process resembles a breakdown of the niobium oxide and leads to a low resistance state of generally less than 5k ohm. Because the forming process involves a breakdown of the insulator, devices so produced tend to have erratic characteristics with the result that identical characteristics are difficult to achieve from one device to another. This is a serious problem when an array is to be formed as the yield of usable devices in the array will be affected. Further, different devices in the array may require different forming voltages in order to produce the final desired characteristics.

Since the forming step is a threshold-type of operation in which a minimum voltage is required, it is not possible to adjust the voltage to get a specific final device characteristic each time. Therefore, the characteristics of formed devices vary from one device to another, making total system design more difficult.

In addition to the lack of reproducibility in devices fabricated using forming voltages, there is no basic understanding of what occurs when the forming voltage is applied. Lack of a sufficient understanding of the process has impeded exploitation and further development of these devices.

Accordingly, it is a primary object of this invention to provide a switchable bistable resistance device which can be fabricated in an "as formed" state without requiring application of forming voltages.

Another object of this invention is to provide a switchable bistable resistance device which is easily fabricated.

Another object of this invention is to provide a switchable bistable resistance device which is more reliable and can be fabricated with reproducible characteristics.

Still another object of this invention is to provide a switchable bistable resistance device which can be fabricated with a plurality of variable characteristics.

SUMMARY OF THE INVENTION

These switchable bistable resistors have two stable resistance states. The devices are fabricated in a formed state and do not require application of a forming voltage to provide the low resistance state.

The switchable medium of the device is an insulator having two stable resistance states. The insulator has impurities therein which provide conduction centers in the insulator for current travel between two electrical contacts to the insulator. The impurities are present in an amount 0.05–10 percent by weight ($10^{18}$–$10^{21}$ impurities per $cm^3$). These impurities are generally selected from the post transition elements (Group V) and can include Bi, Sb, As, P, as well as Ti, and W. A multivalent oxide is a particularly good insulator for these devices.

The electrodes provide electrical contact to the insulator and can be many suitable elements, such as the transition group elements. These include Nb, Ta, Zr, Hf, V, W, Mo, Cr, and Ti. The noble metals, such as Au, Ag, Pt, and Pd are also suitable. Alloys of the transition metals with the dopant impurities of the oxide are also suitable. The electrodes have thicknesses from about 200A to about 10,000A. The thickness of the insulator is 100–2,500A, and is generally about 1,300A.

A particularly good method for providing doped insulators having the proper amount of an impurity therein is the anodization of a metastable alloy base electrode to form the insulator. Another method to fabricate the device uses a heating step to provide diffusion of the atoms of the counter electrode into the insulator when heat is applied to the counter electrode. If impurities are already present in the insulator, an annealing step may be used to distribute them more uniformly in the insulator. Still another method is to deposit an insulator and the dopants directly onto the base electrode.

Since the devices are in a formed state without requiring the use of forming voltages, devices with reproducible characteristics can be obtained. Further, the yield of usable devices increases, since the destructive breakdown voltage normally required for forming is not required. This means that the yield of arrays of switchable resistors is significantly increased.

Another advantage results in that the switchable bistable resistances of this invention have variable resistance ranges depending upon the amount of impurities incorporated in the insulator. This means that the impedance ranges of the bistable resistance devices can be matched to almost any external circuitry, such as field effect devices and ovonic devices, which do not have the same input impedances.

When making arrays of switchable resistances according to this invention, the characteristics of each device in the array can be made substantially the same since the fabrication process does not involve the use of a voltage which causes breakdown in each device. Rather than requiring different breakdown voltages for each device, all devices in an array will be formed after the controllable deposition and doping steps have been accomplished. Consequently, more controllable arrays are possible and the lifetimes of the devices in the array are increased.

These and objects, features and advantages will be more apparent in the following more particular description of the invention.

DETAILED DESCRIPTION OF THE PREFERRED EMBODIMENTS

Figure 1:
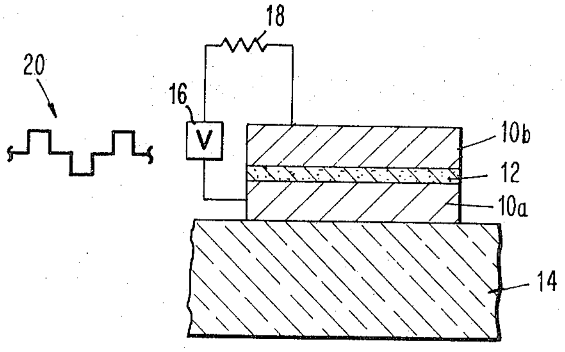
FIG. 1 is a cross-sectional view of a switchable multistate resistance showing possible electrical connections to the device.

FIG. 1 shows a cross-sectional view of the device having electrical switching means connected thereto. The device is comprised of a base electrode 10*a* and a counter electrode 10*b*, both of which make electrical contact to an insulator 12. Although a sandwich type of structure is shown, this is not the only structure possible; it is only necessary that the electrodes 10*a* and 10*b* make electrical contact to the insulator 12. In FIG. 1, the device is located on a substrate 14, which could be, for instance, sapphire or a semiconductor.

Connected across electrodes 10*a* and 10*b* is a voltage source 16 and a current limiting resistor 18. Voltage source 16 provides a bipolar pulse train 20 used to switch the device between two stable resistance states.

This device is characterized in that it is fabricated in a formed state and is capable of exhibiting bistable resistance without the need for application of a forming voltage between electrodes 10*a* and 10*b*. The switchable medium is a doped insulator 12 which has conduction centers therein that are incorporated during the fabrication process. The impurities which produce the conduction centers are present in insulator 12 in the amount 0.05–10 percent by weight, corresponding to $10^{18}$–$10^{21}$ impurities/cm.$^3$.

The electrodes 10*a* and 10*b* are generally 200–10,000A thick, while doped insulator 12 is generally 100–2,500A thick.

Figure 2:
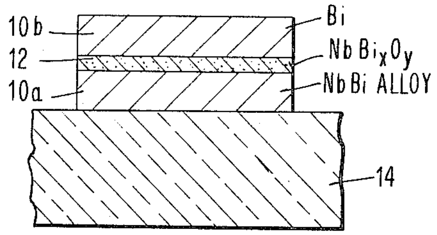
FIG. 2 is a cross-sectional view of a switchable resistance using particular electrodes and an oxide insulator.

FIG. 2 shows a doped insulator device having bistable resistance where the insulator 12 is a particular multivalent oxide. The base electrode 10*a* is a metastable alloy of NbBi and the counter electrode 10*b* is Bi. Multivalent oxide 12 is formed as the native oxide of the base electrode 10*a*. The amount of Bi in oxide 12 is between 0.05 and 10 percent by weight of the weight percent of Nb. As in FIG. 1, the device is prepared on substrate 14 by formation of successive layers 10*a*, 12, and 10*b*. The electrical switching connections are not shown in this figure, since they are the same as those shown in FIG. 1.

The device of FIG. 2 is conveniently fabricated since insulator 12 is a native oxide of the base electrode 10*a*. If base electrode 10*a* is an alloy containing the impurity (in this case Bi) to be incorporated in the insulator to provide conduction centers therein, it is quite simple to merely anodize the base electrode to produce a native oxide which will have the impurities therein in the proper amount. Counter electrode 10*b* is then deposited on amorphous insulator 12.

The devices of this invention have a low resistance state and a high resistance state after fabrication, and therefore do not require application of a forming voltage between electrodes 10*a* and 10*b*. Applicants have discovered that the incorporation of certain impurities in certain amounts in the doped insulator 12 will eliminate the need for a forming voltage. The impurities provide conduction centers to and from which electrons can travel to establish the low and high resistance states of the insulator 12. The impurities can be uniformly distributed throughout insulator 12, or can be present in a plurality of conduction paths between electrodes 10*a* and 10*b*.

By varying the amount of the impurities present in insulator 12, different classes of devices with different resistance ranges will be achieved. Generally, these devices will have the same ratio of low to high resistance but will have different ranges of the low and high resistances, respectively. This is a unique advantage, since the impedance of the switchable resistor can be tailored to other devices in the system. For instance, since FET devices do not have the same input and output impedances as ovonic devices, it is possible to fabricate the present switchable resistors to more closely match circuits using both FET's and ovonic devices.

The particular nature of doped insulator 12 yields the property of two stable resistance states without requiring a forming voltage. Generally, insulator 12 has portions which consist of the insulator in a reduced form, i.e., the insulator has a plurality of chemical forms. For instance, if the insulator is an oxide such as niobium oxide, it will become a reduced oxide when doped. Forms such as $Nb_2O_5$, $Nb_2O_3$, $NbO_2$, NbO, and $Nb_2O_{5-x}$ (where $x$ represents the degree of non-stiochiometry, $x < 1$) may be present. Oxygen vacancies are one kind of defect that is available in the reduced oxide to provide conduction centers.

The defect centers formed within insulator 12 should not move around significantly when high fields are applied in order to retain their relatively uniform distribution. These defects are formed in stable sites in the insulator. That is, the defect centers which provide the conduction centers for electrons traveling between electrodes 10*a* and 10*b* should not be lost by excessive movement at room temperatures.

In addition to the above requirements, the insulator need not be stoichiometric. That is, if the percentage of the impurities in the insulator becomes too great, the material may become an insulating compound which does not exhibit bistable resistance. The dopants can provide extra electrons in the insulator and may create centers which will allow conduction throughout the insulator.

The conduction centers must be located sufficiently close to the electrodes so that charge injection to the conducting center can take place. That is, the current carriers (electrons) must be able to get into and out of the insulator 12. Uniform distribution of the centers sufficiently close to the electrodes will enhance the probability for the current carriers to enter the insulator to initiate the conduction process, since the probability is dependent on the closeness of the centers to the electrodes and on the potential barrier height.

In order to be able to fabricate "as-formed devices," the following table lists the particular materials suitable for the base electrode 10*a*, the switchable doped insulator 12, and the counter electrode 10*b*. It should be realized that additional impurity elements may be incorporated in insulator 12 in order to provide switchable bistable resistance. It is only necessary that the criteria listed above be followed. For instance, the use of multivalent impurity additions is preferable. The impurity element reduces the insulator to a plurality of stable states and thereby forms localized conduction centers.

TABLE OF MATERIALS

| Base Electrode | Switchable Medium | Counter Electrode |
|---|---|---|
| Transition metals, such as Nb, Ta, Zr, Hf, V, Ti, W, Mo, Cr | Native insulators (such as oxides) plus Group V post transition elements, such as Bi, Sb, As, P, and/or other elements, such as Ti, W, in the amount $10^{18}$–$10^{21}$ impurities/cm$^3$ | Any metal, including Nb, Bi, Sb, Al, Au, Ag, etc. Highly doped semiconductors |
| | Non-native insulators, plus the impurities mentioned above in the amount specified | |
| Noble metals, such as Au, Ag, Pt, Pd | Non-native insulators, plus impurity additions including Group V post transition elements Bi, Sb, As, P and/or other elements, such as Ti, W, in the amount $10^{18}$–$10^{21}$ impurities/cm$^3$ | |
| Alloys of transition metals with post transition elements Bi, Sb, As, P, and/or other elements, such as Ti, W | Native insulators of the base electrode, such as native oxides | |

From the foregoing table, it can be seen that the transition elements and the noble metal elements provide suitable base electrodes on which doped insulators can be grown or deposited. It is very convenient to use native oxides of a base electrode having the impurities incorporated therein. Therefore, the use of an alloy (which could be metastable) for the base electrode 10*a* is preferable. The impurity additions to the insulator include the post-transition elements of group V as well as other elements, including Ti and W. The counter electrode 10*b* includes any suitable conductor which does not adversely react with the insulator 12 to affect its switchable properties. Suitable elements include Bi, Sb, Al, Au, Nb.

To illustrate the concept of a suitable bistable resistance device which does not require forming, the following discussion presents some suitable examples.

EXAMPLE 1

$NbBi_x$—$NbBi_xO_y$—Bi devices with $x$ α 0.05–10 weight percent of Nb weight percent $y$ is unspecified as yet, since determination of exact oxidation state has not been measured have been made, without the requirement of forming voltages. The device was made by first sputtering a target electrode of Nb having evaporated Bi dots thereon to form the $NbBi_x$ base electrode. After this, the base electrode is anodized in an ethylene glycol solution of ammonium pentaborate to produce the insulator, which is an oxide of approximately 1,300A thickness. The counter electrode (Bi) was then evaporated onto the oxide, to a thickness of about 4,000A.

During anodization, the Bi in the base electrode appears in the oxide in an amount corresponding to the amount present in the base electrode. The amount of Bi in the base electrode is determined by the amount of Bi in the target to be sputtered to produce the base electrode. From measurements of the superconductive transition temperature ($T_c$) of the base electrode, the amount of Bi present in the electrode can be determined. Actual measurements showed that for $T_c$ = 6.9°K, the Bi weight concentration was 6.3 percent; for $T_c$ = 9.2°K, the Bi weight concentration was less than 0.5 percent; for $T_c$=4.9°K, the Bi weight concentration was about 7 percent.

These devices have a high resistance state typically more than 12$k\Omega$. Reversible switching takes place between these two resistance states, the transition from the high to the low resistance state occuring at about 0.6V, while the threshold currents for the transition from the low resistance state to the high resistance state are about 200 μA.

EXAMPLE 2

$NbSb_x$—$NbSb_xO_y$—Sb devices (where $x$ and $y$ are as in Example 1) can be made by the same procedures used to make the devices of Example 1, except that Sb is substituted for Bi. Additionally, the base electrode can be Nb, while the counter electrode is Sb; heating the device causes atoms from the counter electrode (Sb) to diffuse into the insulation, thereby creating the conduction centers. Anodization of the base electrode, whether Nb or NbSb, is suitable for production of the oxide insulator, although plasma anodization and thermal oxidation can also be used.

EXAMPLE 3

$TaBi_x$—$TaBi_xO_y$—Bi devices with $x$ α 0.05–10 weight percent of Ta weight percent can be made which will not require forming voltages. The method of making these devices is the same as that set forth in Example 1, except that the target electrode is Ta having Bi dots evaporated thereon. A preferable percentage (by weight) of the impurity in the insulator is about 3–7 percent.

Figure 3:
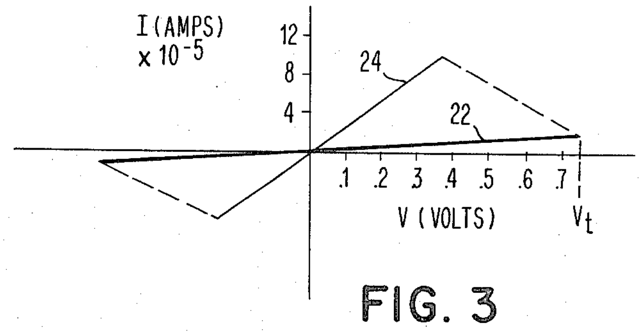
FIG. 3 shows a current versus voltage diagram for a switchable bistable resistance device using a doped insulator.

FIG. 3 shows a current versus voltage diagram of these insulator bistable resistance devices. The device has a high resistance curve 22 and a low resistance curve 24. Upon application of a voltage across electrodes 10*a* and 10*b*, the device initially follows curve 22 until a threshold voltage $V_t$ is reached at which the device switches to the low resistance state represented by curve 24. The device will continue in this state until a negative voltage of sufficient polarity is applied to switch the device back to the high resistance state represented by curve 22. Generally, the counter electrode 10*b* is connected to the positive node of the voltage source 16 when switching the device from high to low resistance and to the negative voltage node of source 16 when switching the device from the low to the high resistance state. The device will provide this switching characteristic at room temperature and at cryogenic temperatures. Switching times of less than 1 microsecond and 20 microseconds for switching from high to low and from low to high resistance states respectively have been observed.

The exact conduction mechanisms occurring are difficult to establish precisely. These mechanisms depend upon the thickness of the insulator and the temperature range of observation. There are a number of phenomena that contribute to electrical conduction, such as tunneling mechanisms, Schottky emission, space charge limited current, and the Poole-Frenkel effect. The particular conduction mechanism also depends upon the electrode materials used. For instance, at higher temperatures (300°K), a space charge limited current flow is believed present for thick insulators (approximately 1,300A). For higher voltages (greater than about 15 volts) and lower temperatures (less than 200°K) experimental data seems to indicate that Schottky emission or the Poole-Frenkel effect dominates the conduction mechanism. In the Poole-Frenkel effect electrons trapped in the bulk of the insulator are excited into the conduction band. Both the Schottky emission and the Poole-Frenkel effect have approximately similar current-voltage relationships. In general, the data at low temperatures indicate that conduction is more by the Poole-Frenkel effect than by Schottky emission.

At temperatures below about 100°K the current-voltage curve becomes relatively temperature independent. Higher voltages can be applied without breakdown of the junction. The particular conduction mechanisms occurring for different materials and for different insulator thicknesses are difficult to precisely determine, and reference is made to the aforementioned literature for possible explanations of the conduction mechanisms. These conduction mechanisms require the type of impurity center or dopant which is described in this application.

METHOD OF FABRICATION

These bistable resistance devices are easily fabricated using known techniques. The fabrication of base electrode 10*a* is achieved by sputtering, evaporation, or any other suitable deposition techniques onto a substrate, such as sapphire. In the case of an alloy base electrode, such as Nb—Bi, co-sputtering of these materials in the proper proportions (0.05–10 percent bismuth) will be sufficient to prepare the base electrode. Also, a niobium target electrode can be previously coated with a pattern of bismuth dots, after which this composite is used as the target electrode in an RF sputtering system, to deposit the base electrode alloy. Another technique for depositing alloy electrodes is to use co-evaporation of the alloy constituents or any other suitable co-deposition technique.

The doped insulator 12 can be prepared in many conventional ways. For instance, anodization of the base electrode can be used to prepare a native oxide on the base electrode. The impurity in the insulator can be diffused into the insulator after it is formed, or can be present while the insulator is being formed. For example, in the case of a Nb—Bi base electrode, anodization in an ethylene glycol solution of ammonium pentaborate can be used to produce niobium oxide having bismuth therein in the proportion $10^{18}$–$10^{21}$ Bi/cm.$^3$. Anodizing at a proper current to a preset voltage will produce an oxide approximately 1,300A thick, well suited for this device. As an alternative, other oxidizing methods such as plasma anodization and controlled thermal oxidation can be used. As was previously mentioned, non-native insulators are suitable, also. For instance, deposition of a non-native insulator followed by diffusion or ion implantation of an impurity will suffice. Also, the insulator can be co-deposited with the impurity by co-evaporation or co-sputtering. After the insulator is formed, it may be desirable to anneal the insulator at an elevated temperature to distribute the impurity atoms in the insulator. It is only necessary that the impurity be present in the described amount and that there be conduction paths between the base electrode and the counter electrode.

The counter electrode 10*b* is deposited on the doped insulator 12 by a variety of deposition techniques, such as evaporation and sputtering. Any conventional means of deposition can be used, as long as the material being deposited for a counter electrode does not adversely react with the insulator to change its form or in any way disrupt its switching properties. As long as the counter electrode material does not react greatly with the insulator to change its chemical form, no harm will occur. Almost any conductor can be used for the counter electrode.

Alternate methods for fabrication also exist. For instance, if it is desired to use a Nb—Bi base electrode, a thin layer of Nb—Bi can be deposited on niobium or other suitable base electrode. The Nb-Bi layer should be sufficiently thick to provide an adequate composite insulator. If an oxide layer is then desired, the oxidation process may be carried out by oxidizing either the entire surface or only the area of the Nb–Bi layer. After this, bismuth or another suitable counter electrode is deposited on the oxide insulator.

Figure 4:
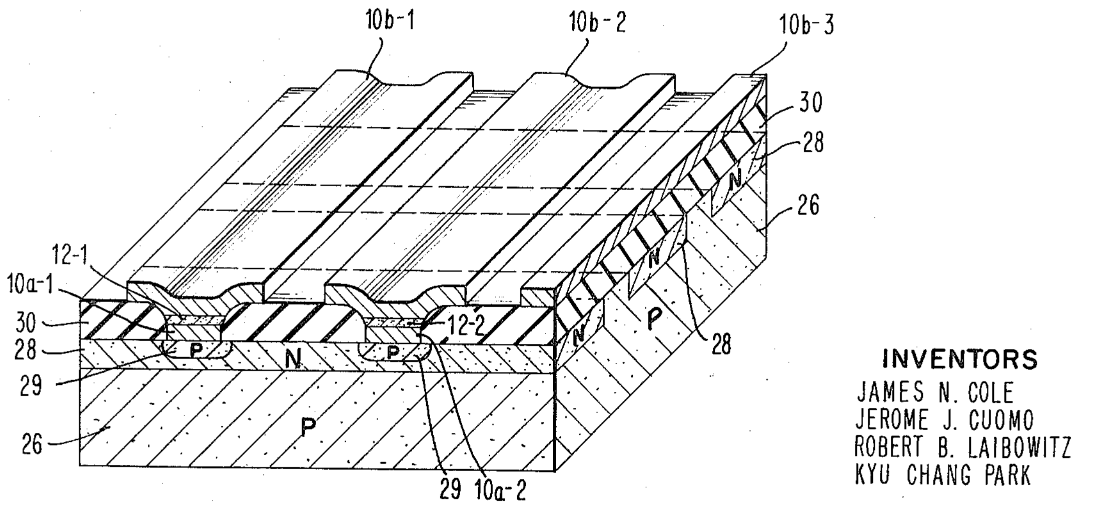
FIG. 4 is a cross-sectional view of an array of switchable bistable resistances according to the present invention.

FIG. 4 shows a composite integrated array of bistable resistance devices using common top electrodes 10*b* for a plurality of devices. This arrangement is suitable for a memory array in which each memory cell comprises a bistable resistance device according to the invention, in series with a diode which prevents sneak paths during switching operations.

The entire array is deposited on a semiconductor substrate 26, in this case a P-type wafer of, for instance, silicon. N-type diffusions 28 are then made in the top surface of wafer 26. These diffusions 28 form coordinate drive lines for the memory array. P-type diffusions 29 are then made in N-diffusions 28, to create P-N junctions for each bistable resistance device. P diffusions 29 are localized diffusions in the area of each bistable resistance device, rather than lines which extend throughout the array.

The other drive lines, orthogonally arranged to diffusions 28, are the counter electrodes 10*b*-1, 10*b*-2, and 10*b*-3. Each of the counter electrodes 10*b* is common to more than one bistable resistance device. However, the base electrodes 10*a* are discrete depositions, as are the insulators 12. This means that each bistable resistance device in a row will be isolated electrically from other bistable resistance devices in that row, and from other such devices in adjacent rows. For instance, the bistable resistance device comprising base electrode 10*a*-1, insulator 12-1, and counter electrode 10*b*-1 is electrically insulated from other bistable resistance devices in row 1, as well as being electrically insulated from bistable resistance devices in row 2, such as that comprising counter electrode 10*a*-2 and counter electrode 10*b*-2. Insulation between devices is provided by insulating layer 30 (such as $SiO_2$) which is deposited on the top surface of wafer 26.

For a detailed description of the operation of such a memory array, reference is made to an IBM Technical Disclosure Bulletin report entitled "$Nb_2O_5$ Memory Cells," Vol. 13, No. 5, October 1970, on page 1189. In the present application, it is only necessary to state that electrical signals are applied to the N-type diffusions 28 and to the counter electrodes 10*b* in order to switch the resistance states of the bistable resistance devices. A coincidence selection technique is used in which the coincident application of voltage pulses on any of the drive lines will switch the bistable resistance device at the intersection of the drive lines.

For non-destructive read out, the selected *x* drive line (for instance, a diffusion 28) is connected to a pulse source which supplies a sense pulse that is not large enough to disturb either resistance state of the selected bistable resistance device. Simultaneously, the selected *y* drive line (for instance, a counter electrode 10*b*) is connected to a sense amplifier. If the selected bistable resistance device is in the low resistance state, a large sense voltage (representative of a binary 1) will be developed. If the selected memory cell is in the high resistance state, a small voltage drop will result, representing a binary 0. Selection of any memory cell in the array leaves all other paths in the array blocked by at least one or more of the P-N diodes (diffusions 28, 29) which are biased in a reverse direction and below their reverse breakdown voltages.

What has been described is a new switchable bistable resistance device using doped insulators as the switching medium. Because these insulators contain previously formed conduction centers, no forming voltage is required to obtain a bistable resistance characteristic in the devices. This contrasts with prior art devices that require a forming voltage in order to lower the resistance state of the device to that necessary for switching between resistance states.

The device uses many materials for electrodes sand many insulators for the switchable medium. In particular, multivalent oxides having impurities from the group V post-transition elements provide good bistable resistance devices. Many techniques can be used to fabricate these devices, and their advantages result from the fact that the devices are fabricated in a "as-formed state." The invention primarily resides in the discovery that impurities in the amorphous insulator in prescribed amounts will yield amorphous insulators having switchable resistance states without application of a forming voltage. The teaching of this application should be sufficient to enable one of skill in the art to devise numerous insulators having proper impurities for switching.

What is claimed is:

1. A device exhibiting two stable resistance states in a single quadrant of its current-voltage characteristic, comprising:

a first electrode comprised of a Nb alloy having therein an element selected from the group consisting of Bi, Sb, As, P, Ti, and W, an Nb oxide insulator in contact with said first electrode, said insulator having therein as an impurity at least one of said elements present in said first electrode in an amount 0.05–10 percent by weight of said insulator, and a second electrode comprised of Bi in contact with said insulator.

2. A device exhibiting two stable resistance states in a single quadrant of its current-voltage characteristic, comprising:

a first electrode comprising an Nb—Bi alloy having therein an element selected from the group consisting of Bi, Sb, As, P, Ti and W, an insulator comprising an oxide having Nb and Bi therein in contact with said first electrode, said Bi being present in said insulator in an amount 0.05–10 percent by weight of said insulator, and a second electrode in contact with said insulator, said second electrode being selected from the group consisting of Nb, Bi, and Sb.

3. A device exhibiting two stable resistance states in a single quadrant of its current-voltage characteristic, comprising:

a first electrode comprised of an alloy of Nb and Bi, a second electrode comprised of a conducting material, and an insulator comprised of Nb oxide having Bi therein in an amount 0.05–10 percent by weight, said insulator being a multivalent oxide with said Bi distributed uniformly therein.

4. A device exhibiting two stable resistance states in a single quadrant of its current-voltage characteristic, comprising:

a base electrode comprising Nb, an insulator in contact with said base electrode, said insulator comprising Nb oxide having distributed uniformly therein an impurity selected from the group consisting of Bi, Sb, As, P, Ti, and W in an amount $10^{18}$–$10^{21}$ impurities/$cm^3$, and a counter electrode in contact with said insulator, said counter electrode being selected from the group consisting of Nb, Bi, and Sb.

5. The device of claim 4, where said insulator is 100–2,500A thick.

6. The device of claim 4, where said insulator is an anodic oxide of Nb.

* * * * *